(12) United States Patent
Wen et al.

(10) Patent No.: US 8,648,421 B2
(45) Date of Patent: Feb. 11, 2014

(54) ELECTROSTATIC DISCHARGE (ESD) DEVICE AND SEMICONDUCTOR STRUCTURE

(75) Inventors: Yung-Ju Wen, Taoyuan County (TW); Chang-Tzu Wang, Taoyuan County (TW); Tien-Hao Tang, Hsinchu (TW); Kuan-Cheng Su, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 231 days.

(21) Appl. No.: 13/290,399

(22) Filed: Nov. 7, 2011

(65) Prior Publication Data

US 2013/0113045 A1 May 9, 2013

(51) Int. Cl.
*H01L 23/60* (2006.01)

(52) U.S. Cl.
USPC ............... 257/360; 257/401; 257/E23.194

(58) Field of Classification Search
USPC .......................................... 257/358
See application file for complete search history.

(56) References Cited

U.S. PATENT DOCUMENTS

| | | | |
|---|---|---|---|
| 5,637,900 A | 6/1997 | Ker et al. | |
| 5,959,820 A | 9/1999 | Ker et al. | |
| 6,724,677 B1 | 4/2004 | Su et al. | |
| 6,909,149 B2 | 6/2005 | Russ et al. | |
| 6,927,458 B2 * | 8/2005 | Worley | 257/361 |
| 7,009,252 B2 | 3/2006 | Lin et al. | |
| 7,027,276 B2 | 4/2006 | Chen | |
| 7,205,612 B2 | 4/2007 | Cai et al. | |
| 7,368,761 B1 | 5/2008 | Lai et al. | |
| 7,557,413 B2 * | 7/2009 | Chen | 257/360 |
| 7,672,100 B2 | 3/2010 | Van Camp | |
| 2003/0076636 A1 | 4/2003 | Ker et al. | |
| 2006/0267102 A1 | 11/2006 | Cheng et al. | |

OTHER PUBLICATIONS

Ming-Dou Ker et al, "The Impact of Inner Pickup on ESD Robustness of Multi-Finger NMOS in Nanoscale CMOS Technology" Reliability Physics Symposium Proceedings, 2006. 44th Annual., IEEE International, pp. 631-632.
Ming-Dou Ker et al., "Layout Design on Multi-Finger MOSFET for On-Chip ESD Protection Circuits in a 0.18-μM Salicided CMOS Process" 2001. The 8th IEEE International Conference on Electronics, Circuits and Systems, 2001. ICECS , pp. 361-364.
K. Bock et al., "Influence of Gate Length on ESD-Performance for Deep Sub Micron CMOS Technology" Electrical Overstress/Electrostatic Discharge Symposium Proceedings, 1999, pp. 2A.5.1-2A5. 10.
Thomas L. Polgree et al., "Improving the ESD Failure Threshold of Silicided n-MOS Output Transistors by Ensuring Uniform Current Flow" IEEE Transactions on Electron Device, vol. 39, No. 2, Feb. 1992, pp. 379-388.

(Continued)

*Primary Examiner* — Stephen W Smoot
(74) *Attorney, Agent, or Firm* — J.C. Patents

(57) ABSTRACT

An electrostatic discharge (ESD) device is described, including a gate line, a source region at a first side of the gate line, a comb-shaped drain region disposed at a second side of the gate line and having comb-teeth parts, a salicide layer on the source region and the drain region, and contact plugs on the salicide layer on the source region and the drain region. Each comb-teeth part has thereon, at a tip portion thereof, at least one of the contact plugs.

14 Claims, 2 Drawing Sheets

(56) References Cited

OTHER PUBLICATIONS

Tung-Yang Chen et al., "Experimental Investigation on the HBM ESD Characteristics of CMOS Devices in a 0.35-μm Silicided Process" 1999. International Symposium on VLSI Technology, Systems, and Applications, pp. 35-38.

Ajith Amerasekera et al., "Correlating Drain Junction Scaling, Salicide Thickness, and Lateral NPN Behavior, With the ESD/EOS Performance of a 0.25 μm CMOS Process" 1996 International Electron Devices Meeting, pp. 893-896.

Jian-Hsing Lee et al., "An Analytical Model of Positive H.B.M. ESD Current Distribution and the Modified Multi-Finger Protection Structure" 1999. Proceedings of the 1999 7th International Symposium on the Physical and Failure Analysis of Integrated Circuits, pp. 162-167.

Ajith Amerasekera et al., "The Impact of Technology Scaling on EDS Robustness and Protection Circuit Design" IEEE Transactions on Components, Packaging, and Manufacturing Technology—Part A, vol. 18, No. 2, Jun. 1995, pp. 314-320.

Ming-Dou Ker et al., "Impact of Layout Pickups to ESD Robustness of MOS Transistors in Sub 100-nm CMOS Process" 2010 International Symposium on Next-Generation Electronics (ISNE), pp. 100-103.

Yong-Ru Wen et al., "A Bending N-Well Ballast Layout to Improve ESD Robustness in Fully-Silicided CMOS Technology" 2010 IEEE International Reliability Physics Symposium (IRPS), pp. 857-860.

Yong-Ru Wen et al., "Design to Enhance Turn-On Uniformity of Multi-Finger ESD Protection Devices" A Thesis Submitted to Department of Electronics engineering and Institute of Electronics College of Electrical and computer Engineering National Chiao Tung University in Partial Fulfillment of the Requirements for the Degree of Master in Electronic Engineering, Sep. 2009, Hisnchu, Taiwan, Republic of China.

\* cited by examiner

ELECTROSTATIC DISCHARGE (ESD) DEVICE AND SEMICONDUCTOR STRUCTURE

BACKGROUND OF THE INVENTION

1. Field of Invention

This invention relates to a semiconductor device, and more particularly relates to an electrostatic discharge (ESD) device and a semiconductor structure derived from it.

2. Description of Related Art

For sufficient ESD robustness of the ESD devices in CMOS integrated circuits, a salicide (self-aligned silicide) blocking (SAB) layer can be disposed on the drain-side diffusion to block salicide formation thereon and thus prevent current localization and provide a ballast resistance to increase the current uniformity at the drain-side.

FIG. 1 illustrates a layout of a series of conventional ESD devices with shared source/drain regions. Each ESD device includes a gate line 110 on a substrate 100, a source region 120 at one side of the gate line 110, a drain region 130 at the other side of 110 shared with another ESD device, a ring-shaped SAB layer 140 partially covering the drain region 130, a salicide layer 150 on the source region 120 and on the portions of the drain region 130 not covered by the SAB layer 140, contact plugs 160a on the salicide layer 150 on the source region 120, and contact plugs 160b on the salicide layer 150 on the drain region 130 surrounded by the SAB layer 140.

However, in an advanced process forming high-k gate dielectric and metal gates, a SAB layer may not be present. Hence, a design that sustains high ESD robustness in fully salicided ESD devices is required. Though increasing the distance ($D_{cg}$) between the gate line 110 and the nearest contact plugs 160b in the conventional ESD devices can prevent current localization and provide a larger ballast resistance to enhance the ESD robustness, the area of drain-side diffusion or the ESD device is much increased.

SUMMARY OF THE INVENTION

Accordingly, this invention provides ESD device that has higher ESD robustness without increasing the device dimension.

This invention also provides a semiconductor structure that is derived from the ESD device of this invention.

The ESD device of this invention includes a gate line, a source region at a first side of the gate line, a comb-shaped drain region disposed at a second side of the gate line and having a plurality of comb-teeth parts, a salicide layer on the source and drain regions, and a plurality of contact plugs on the salicide layer on the source region and the drain region. Each comb-teeth part has thereon, at the tip portion thereof, at least one of the contact plugs.

The semiconductor structure of this invention includes two above ESD devices of this invention that are arranged in a complementary manner, in which the two comb-shaped drain regions of the two ESD devices face each other, the comb-teeth parts of the first drain region and those of the second drain region are arranged alternately, and the comb-teeth parts of the first drain region are separated from those of the second drain region by a device isolation layer.

In some embodiments, the above ESD device or semiconductor structure further includes a salicide block (SAB) layer covering a portion of each comb-teeth part of the drain region (s), wherein the salicide layer is not disposed on the portions of the comb-teeth parts covered by the SAB layer.

Since the drain region has a comb shape and the contact plugs of the drain region are disposed at the tip portion of the comb-teeth parts of the comb-shaped drain region in the ESD device of this invention, the distance ($D_{cg}$) between the gate line and the contact plugs is much increased as illustrated later. Therefore, even when a SAB layer is absent, current localization still can be effectively prevented and a sufficient ballast resistance can be provided to enhance the ESD robustness.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit the scope of this invention.

Figure 2:
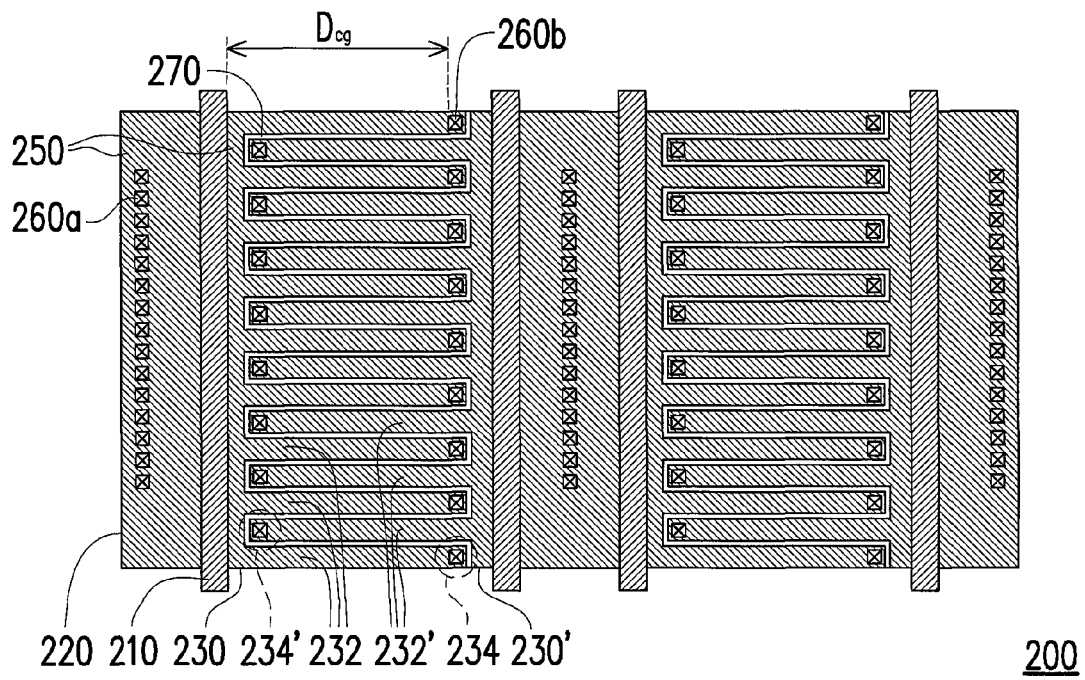
FIG. 2 illustrates a layout of a series of ESD devices and the derivative semiconductor structure according to a first embodiment of this invention.

FIG. 2 illustrates a layout of a series of ESD devices and the derivative semiconductor structure according to a first embodiment of this invention.

Referring to FIG. 2, each of the ESD devices includes a gate line 210 disposed on a semiconductor substrate 200, a source region 220 in the substrate 200 at a first side of the gate line 210, a comb-shaped drain region 230 disposed in the substrate 200 at a second side of the gate line 210 and having a plurality of comb-teeth parts 232, a salicide layer 250 on the source region 220 and the drain region 200, a plurality of contact plugs 260a on the salicide layer 250 on the source region 220, and a plurality of contact plugs 260b on the salicide layer 250 on the drain region 230. Each comb-teeth part 232 of the comb-shaped drain region 230 has thereon, at the tip portion 234 thereof, a contact plug 260b. An ESD device may share a source region 220 with an adjacent ESD device, as shown in the figure.

The semiconductor substrate 200 may be a lightly doped silicon substrate. The gate line 210 may include doped poly-Si or a metallic substance, and may be separated from the substrate 200 by a high-k gate dielectric (not shown). The metallic substance may include a work-function metallic material, optionally in combination with a low-resistance metallic material. Examples of the work-function metallic material for the gate of a P-type device include, but are not limited to, titanium nitride (TiN) and tantalum carbide (TaC). Examples of the work-function metallic material for the gate of an N-type device include, but are not limited to, TiAl, ZrAl, WAl, TaAl or HfAl. Examples of the optional low-resistance metallic material include Al, Ti, Ta, W, Nb, Mo, Cu, TiN, titanium carbide (TiC), tantalum nitride (TaN), Ti/W, and Ti/TiN. In an embodiment, the substrate 200 is lightly P-doped and the source region 220 and the drain region 230 are N-doped, so that the ESD devices are NMOS transistors. The salicide layer 250 may include titanium silicide, cobalt silicide, or a silicide of any other suitable refractory metal. The contact plugs 260a and 260b may include copper (Cu), tungsten (W) or aluminum (Al).

Referring to FIG. 2 again, in the semiconductor structure derived from the above ESD devices, two ESD devices are arranged in a complementary manner. More specifically, the two comb-shaped drain regions 230 and 230' of the two ESD devices face each other, the comb-teeth parts 232 of the first drain region 230 and the comb-teeth parts 232' of the second drain region 230' are arranged alternately in the extension of the gate line 210, and the comb-teeth parts 232 of the first drain region 230 are separated from the comb-teeth parts 232' of the second drain region 230' by a device isolation layer 270. The device isolation layer 270 may be a shallow trench isolation (STI) layer, which may include silicon oxide.

Figure 3:
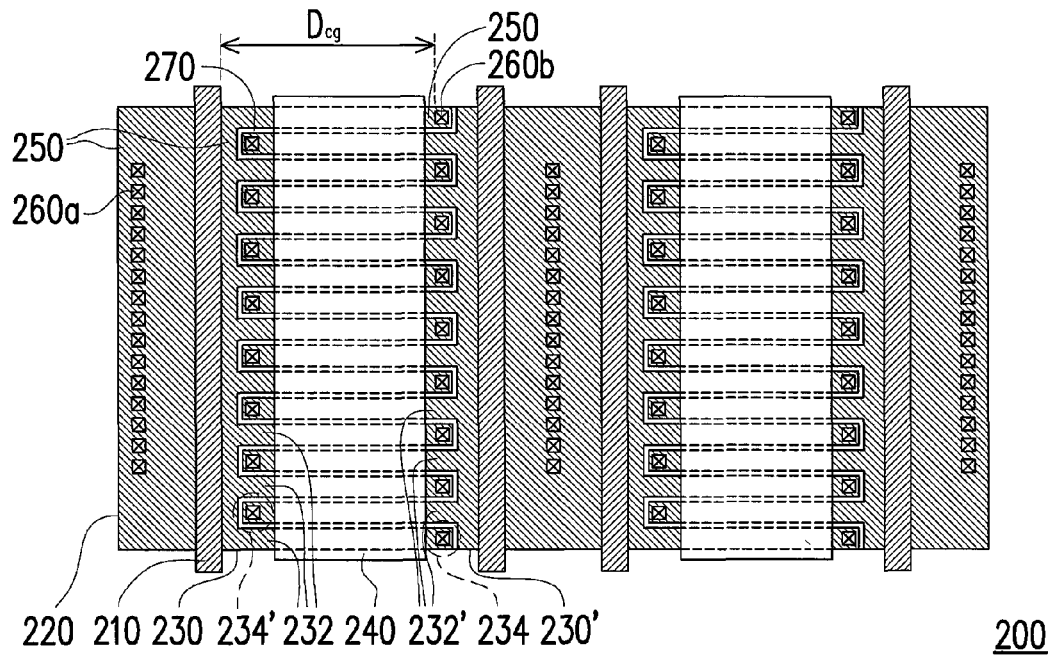
FIG. 3 illustrates a layout of a series of ESD devices and the derivative semiconductor structure according to a second embodiment of this invention.

Besides, when the IC process includes formation of salicide block (SAB), a SAB layer may be formed before the salicide layer 250 is formed. Such an embodiment is shown in FIG. 3, which illustrates a layout of a series of ESD devices and the derivative semiconductor structure according to a second embodiment of this invention.

The major difference of the ESD device or the semiconductor structure of the second embodiment from that of the first embodiment include that a SAB layer 240 is further disposed covering a portion of each comb-teeth part 232/232' of each drain region 230/230', wherein the salicide layer 250 is not disposed on the portions of the comb-teeth parts 232/232' covered by the SAB layer 240.

In an embodiment, the SAB layer 240 covers all area of each comb-teeth part 232/232' except its tip portion 234/234' for forming a contact plug 260b and the portion thereof beside the tip portions 234'/234 of the neighboring comb-teeth parts 232'/232, so as to provide a maximal salicide-free area for each comb-teeth part 232/232', and thereby provide a maximal ballast resistance between the gate line 210 and the drain-side contact plugs 260b to maximize the ESD robustness of the ESD devices.

In addition, in the design where only one contact plug 260b is disposed at the tip portion 234 of each comb-teeth part 232 of each drain region 230, the number of the drain-side contact plugs 260b is a little less than the number of the source-side contact plugs 260a. In order to reduce the difference between the two numbers or equalize the two numbers, or in order to make the drain-side contact plugs 260b more than the source-side contact plugs 260a, two or more contact plug 260b can be disposed at the tip portion 234 of each comb-teeth part 232 of each drain region 230. The two or more contact plugs 260b may be arranged in a m×n array, wherein m is the number of the row(s) of the array and is larger than or equal to one (m≥1), n is the number of the column(s) of the array and is larger than or equal to one (n≥1), and m and n are not simultaneously equal to one (m+n≥3). It is particularly noted that in this disclosure and the claims, the row direction is the extension direction of each comb-teeth part (232) of each drain region (230), and the column direction is the extension direction of each gate line (210).

FIGS. 4A-4E illustrate five examples of disposing an array of contact plugs at the tip portion of each comb-teeth part of the comb-shaped drain region of each ESD device according to another embodiment of this invention.

Figure 4A:
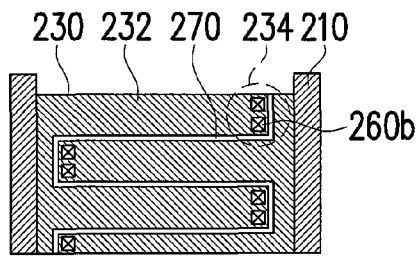
FIGS. 4A-4E illustrate five examples of disposing an array of contact plugs at the tip portion of each comb-teeth part of the comb-shaped drain region of each ESD device according to another embodiment of this invention.
Figure 4B:
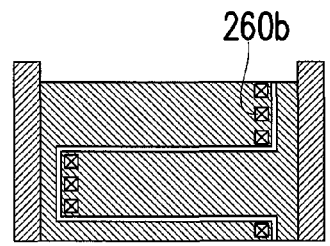

In the examples of FIGS. 4A-4B, the row number (m) of the contact plug array is larger than one while the column number (n) of the same fixed at one, such that the number of the drain-side contact plugs 260b is closer from below or equal to the number of the source-side contact plugs 260a. The contact plug array in the example of FIG. 4A is a 2×1 array, and the contact plug array in the example of FIG. 4B is a 3×1 array.

Figure 4C:
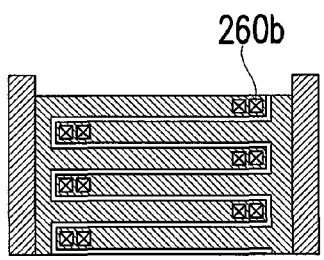
Figure 4D:
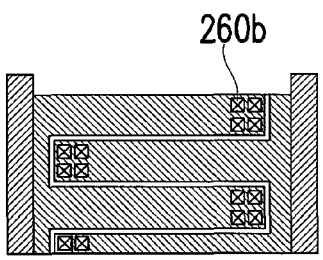
Figure 4E:
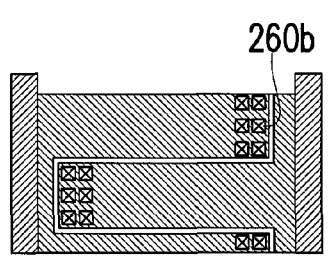

In the examples of FIGS. 4C-4E, the column number (n) of the contact plug array is larger than one, such that the number of the drain-side contact plugs 260b is much more than the number of the source-side contact plugs 260a. The contact plug array in the example of FIG. 4C is a 1×2 array, the contact plug array in the example of FIG. 4D is a 2×2 array, and the contact plug array in the example of FIG. 4E is a 3×2 array. The column number (n) of the contact plug array in each of the three examples is equal to 2.

Figure 1:
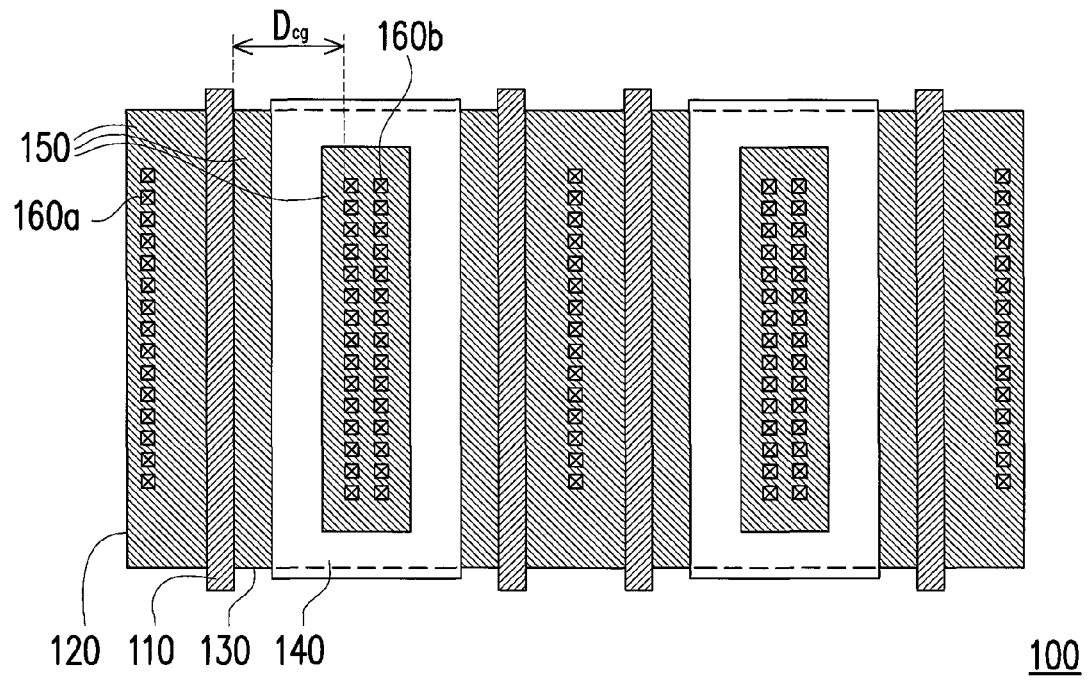
FIG. 1 illustrates a layout of a series of conventional ESD devices in the prior art.

Since the drain region has a comb shape and the contact plugs of the drain region are disposed at the tip portion of the comb-teeth parts of the comb-shaped drain region in the ESD device of this invention, as shown in FIGS. 2-3, the distance ($D_{cg}$) between the gate line and the contact plugs is much increased as compared to the prior-art case (FIG. 1). Hence, even when a SAB layer is absent, current localization still can be effectively prevented and a sufficient ballast resistance can be provided to enhance the ESD robustness.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An electrostatic discharge (ESD) device, comprising:
   a gate line;
   a source region at a first side of the gate line;
   a comb-shaped drain region at a second side of the gate line, having a plurality of comb-teeth parts;
   a salicide layer on the source region and the drain region;
   a salicide block (SAB) layer covering a portion of each comb-teeth part of the drain region, wherein the salicide layer is not disposed on the portions of the comb-teeth parts covered by the SAB layer; and
   a plurality of contact plugs on the salicide layer on the source region and the drain region,
   wherein each comb-teeth part has thereon, at a tip portion thereof, at least one of the contact plugs.

2. The ESD device of claim 1, wherein each comb-teeth part has thereon, at the tip portion thereof, two or more contact plugs.

3. The ESD device of claim 2, wherein the contact plugs at the tip portion of each comb-teeth part are arranged in a m×n array, wherein m≥1, n≥1 and m+n≥3.

4. The ESD device of claim 1, which shares the source region with another ESD device of claim 1.

5. A semiconductor structure comprising two ESD devices of claim 1, wherein
   the two ESD devices respectively includes a first drain region having a plurality of first comb-teeth parts, and a second drain region facing the first drain region and having a plurality of second comb-teeth parts,
   the first comb-teeth parts and the second comb-teeth parts are arranged alternately, and
   the first comb-teeth parts are separated from the second comb-teeth parts by a device isolation layer.

6. The semiconductor structure of claim 5, further comprising a salicide block (SAB) layer covering a portion of each first comb-teeth part of the first drain region and a portion of each second comb-teeth part of the second drain region, wherein the salicide layer is not disposed on the portions of the first and the second comb-teeth parts covered by the SAB layer.

7. The semiconductor structure of claim 5, wherein each first or second comb-teeth part has thereon, at the tip portion thereof, two or more contact plugs.

8. The semiconductor structure of claim 7, wherein the contact plugs at the tip portion of each first or second comb-teeth part are arranged in a m×n array, wherein m≥1, n≥1 and m+n≥3.

9. The semiconductor structure of claim 5, wherein at least one of the two ESD devices shares its source region with another ESD device.

10. A semiconductor structure, comprising:
two ESD devices, each ESD devices comprising:
a source region at a first side of the gate line;
a comb-shaped drain region at a second side of the gate line, having a plurality of comb-teeth parts;
a salicide layer on the source region and the drain region; and
a plurality of contact plugs on the salicide layer on the source region and the drain region, wherein each comb-teeth part has thereon, at a tip portion thereof, at least one of the contact plugs,
wherein the two ESD devices respectively includes a first drain region having a plurality of first comb-teeth parts, and a second drain region facing the first drain region and having a plurality of second comb-teeth parts, the first comb-teeth parts and the second comb-teeth parts are arranged alternately, and
the first comb-teeth parts are separated from the second comb-teeth parts by a device isolation layer, wherein the device isolation layer comprises a shallow trench isolation (STI) layer.

11. The semiconductor structure of claim 10, further comprising a salicide block (SAB) layer covering a portion of each first comb-teeth part of the first drain region and a portion of each second comb-teeth part of the second drain region, wherein the salicide layer is not disposed on the portions of the first and the second comb-teeth parts covered by the SAB layer.

12. The semiconductor structure of claim 10, wherein each first or second comb-teeth part has thereon, at the tip portion thereof, two or more contact plugs.

13. The semiconductor structure of claim 12, wherein the contact plugs at the tip portion of each first or second comb-teeth part are arranged in a m×n array, wherein m≥1, n≥1 and m+n≥3.

14. The semiconductor structure of claim 10, wherein at least one of the two ESD devices shares its source region with another ESD device.

* * * * *